(12) United States Patent
Mori et al.

(10) Patent No.: US 12,445,126 B2
(45) Date of Patent: Oct. 14, 2025

(54) SEMICONDUCTOR INTEGRATED CIRCUIT

(71) Applicant: Kioxia Corporation, Tokyo (JP)

(72) Inventors: Kayo Mori, Kanagawa (JP); Kouichi Tashiro, Kanagawa (JP); Akihiro Fukushima, Kanagawa (JP)

(73) Assignee: Kioxia Corporation, Tokyo (JP)

( * ) Notice: Subject to any disclaimer, the term of this patent is extended or adjusted under 35 U.S.C. 154(b) by 233 days.

(21) Appl. No.: 18/163,839

(22) Filed: Feb. 2, 2023

(65) Prior Publication Data

US 2023/0412170 A1 Dec. 21, 2023

(30) Foreign Application Priority Data

Jun. 17, 2022 (JP) ................................. 2022-097685

(51) Int. Cl.
*H03K 17/567* (2006.01)

(52) U.S. Cl.
CPC .................. *H03K 17/567* (2013.01)

(58) Field of Classification Search
CPC ......... H03K 17/567; H03K 2217/0063; H03K 17/164; H03K 17/56; H03K 17/04; H03K 2217/0081
See application file for complete search history.

(56) References Cited

U.S. PATENT DOCUMENTS

| | | | |
|---|---|---|---|
| 7,977,822 B2 * | 7/2011 | Flynn | H03K 19/0016 307/115 |
| 9,436,252 B2 | 9/2016 | Sasaki | |
| 10,921,874 B2 | 2/2021 | Ehmann | |
| 2016/0182041 A1 * | 6/2016 | Kunie | H03K 17/687 327/427 |

FOREIGN PATENT DOCUMENTS

| | | |
|---|---|---|
| JP | 2012048562 A | 3/2012 |
| JP | 5893336 B2 | 3/2016 |

* cited by examiner

*Primary Examiner* — Metasebia T Retebo
(74) *Attorney, Agent, or Firm* — Kim & Stewart LLP (57) ABSTRACT

A semiconductor integrated circuit includes a switch circuit that includes a plurality of first switch circuits each allowing a first current to flow and a plurality of second switch circuits each allowing a second current larger than the first current to flow, wherein each of the plurality of first switch circuits and the plurality of second switch circuits are configured to switch between an on state of supplying voltage to a respective one of a plurality of circuits connected thereto and an off state of cutting off the voltage supplied to the respective one of the plurality of circuits connected thereto, and a control circuit configured to switch to the on state the first switch circuits and then the second switch circuits. Two or more of the first switch circuits or two or more of the second switch circuits are simultaneously switched to the on state according to a parameter.

17 Claims, 8 Drawing Sheets

| COUNTER VALUE | SWITCH CONTROL LINE | | | | | | | | | |
|---|---|---|---|---|---|---|---|---|---|---|
| | [79] | [78] | [77] | [76] | ... | [4] | [3] | [2] | [1] | [0] |
| 0 | 0 | 0 | 0 | 0 | ... | 0 | 0 | 0 | 0 | 0 |
| 1 | 0 | 0 | 0 | 0 | ... | 0 | 0 | 0 | 0 | 1 |
| 2 | 0 | 0 | 0 | 0 | ... | 0 | 0 | 0 | 1 | 1 |
| 3 | 0 | 0 | 0 | 0 | ... | 0 | 0 | 1 | 1 | 1 |
| 4 | 0 | 0 | 0 | 0 | ... | 0 | 1 | 1 | 1 | 1 |
| ⋮ | | | | | ⋮ | | | | | |
| 77 | 0 | 0 | 0 | 1 | ... | 1 | 1 | 1 | 1 | 1 |
| 78 | 0 | 0 | 1 | 1 | ... | 1 | 1 | 1 | 1 | 1 |
| 79 | 0 | 1 | 1 | 1 | ... | 1 | 1 | 1 | 1 | 1 |
| 80 | 1 | 1 | 1 | 1 | ... | 1 | 1 | 1 | 1 | 1 |

SEMICONDUCTOR INTEGRATED CIRCUIT

CROSS-REFERENCE TO RELATED APPLICATION

This application is based upon and claims the benefit of priority from Japanese Patent Application No. 2022-097685, filed Jun. 17, 2022, the entire contents of which are incorporated herein by reference.

FIELD

Embodiments described herein relate generally to a semiconductor integrated circuit.

BACKGROUND

A semiconductor integrated circuit, which controls a supply of power source voltage to a plurality of electric circuit components, is known. The semiconductor integrated circuit supplies the power source voltage to each of the plurality of electric circuit components, respectively. Such a semiconductor integrated circuit has an active state and a standby state. The active state is a state of supplying power source voltage to each of a plurality of electric circuit components. The standby state is a state of not supplying power source voltage to at least some of the electric circuit components. The semiconductor integrated circuit is required to suitably switch between the active state and the standby state.

DETAILED DESCRIPTION

Embodiments provide a semiconductor integrated circuit capable of suitably switching between an active state and a standby state.

In general, according to one embodiment, a semiconductor integrated circuit includes a switch circuit that includes a plurality of first switch circuits each allowing a first current to flow and a plurality of second switch circuits each allowing a second current larger than the first current to flow, wherein each of the plurality of first switch circuits and the plurality of second switch circuits is configured to switch between an on state of supplying voltage to a respective one of a plurality of circuits connected thereto and an off state of cutting off the voltage supplied to the respective one of the plurality of circuits connected thereto, and a control circuit configured to switch to the on state the first switch circuits and then the second switch circuits, wherein two or more of the first switch circuits or two or more of the second switch circuits are simultaneously switched according to a parameter.

Hereinafter, embodiments for carrying out the present disclosure will be described with reference to the drawings. The drawings are schematic, and for example, a relationship between a thickness and plane dimensions, a ratio of a thickness of each layer, and the like may be different from actual ones. Further, in embodiments, parts that are substantially the same are denoted by the same reference numerals, and the descriptions thereof will be omitted or simplified.

First Embodiment

Figure 1:
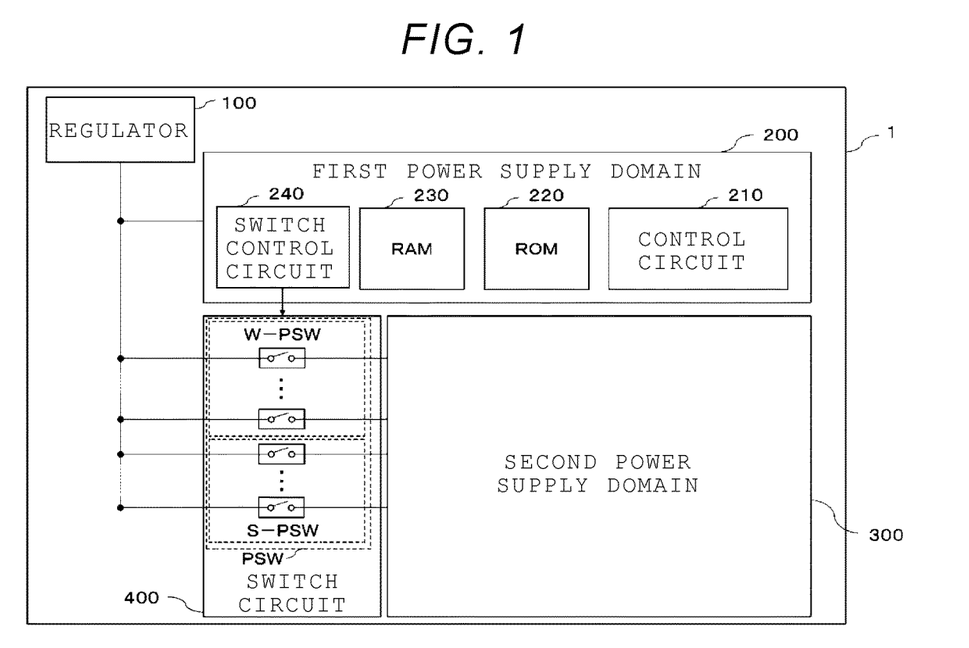
FIG. 1 is a block diagram illustrating an example of a configuration of a semiconductor device including a semiconductor integrated circuit according to a first embodiment.

FIG. 1 is a block diagram illustrating an example of a configuration of a semiconductor device including a semiconductor integrated circuit according to a first embodiment. A semiconductor device 1 includes a regulator 100, a first power supply domain 200, a second power supply domain 300, and a switch circuit 400. A portion of the first power supply domain 200 and the switch circuit 400 are an example of the semiconductor integrated circuit. The semiconductor device in FIG. 1 may consist of multiple semiconductor integrated circuits or a single semiconductor integrated circuit.

The regulator 100 generates power source voltage. The regulator 100 can supply the generated power source voltage to the first power supply domain 200 and the second power supply domain 300, for example. Regulator 100 is an example of a power supply circuit.

The first power supply domain 200 is connected to the regulator 100. The first power supply domain 200 is a group of devices (e.g., a group of circuits) to which the power source voltage generated by the regulator 100 is supplied. Examples of the devices in the first power supply domain 200 include a control circuit 210, a read only memory (ROM) 220, a random access memory (RAM) 230, and a switch control circuit 240. The first power domain 200 is an example of a first circuit domain.

For example, the control circuit 210 is a central processing unit (CPU). The control circuit 210 controls an overall operation of the semiconductor device 1. The ROM 220 is a storage device that stores data in a nonvolatile manner. For example, the ROM 220 is a NAND flash memory or a NOR flash memory. Further, the ROM 220 may be embedded in the control circuit 210. For example, the ROM 220 stores firmware. The RAM 230 is a storage device for storing data. For example, the RAM 230 is a dynamic random access memory (DRAM) or a static random access memory (SRAM). For example, the RAM 230 can store firmware read from any of the ROM 220 and the external storage device (not illustrated) of the semiconductor device 1. In the present embodiment, the RAM 230 stores the firmware related to the control of the switch control circuit 240. The firmware related to the control of the switch control circuit 240 processes the parameters described below. Further, the RAM 230 is used as a working area of the control circuit 210. For example, the switch control circuit 240 is a CPU. The switch control circuit 240 controls the switch circuit 400. The switch control circuit 240 may be in the control circuit 210.

The second power supply domain 300 is a group of devices (e.g., a group of circuits) to which the power source voltage generated by the regulator 100 is supplied via the switch circuit 400. For example, the device in the second power supply domain 300 is an interface circuit (not illustrated) that controls communication with the outside of the semiconductor device 1. The second power domain 300 is an example of a second circuit domain. The second power supply domain 300 has a state of being electrically disconnected from the regulator 100 such that the power source voltage is not supplied, and a state of being electrically connected to the regulator 100 such that the power source voltage is supplied. In the semiconductor device 1, the state where the power source voltage is not supplied to the second power supply domain 300 is referred to as the standby state. In the semiconductor device 1, the state where the power source voltage is supplied to the second power supply domain 300 is referred to as the active state. More power is consumed in the active state than in the standby state. In addition, there may be a plurality of power supply domains in the state of being electrically disconnected from the regulator 100 such that the power source voltage is not supplied, and in the state of being electrically connected to the regulator 100 such that the power source voltage is supplied.

The switch circuit 400 is connected to the regulator 100 and the second power supply domain 300. The switch circuit 400 controls the supply of the power source voltage from the regulator 100 to the second power supply domain 300. The switch circuit 400 includes a plurality of first switches and a plurality of second switches. The plurality of first switches and the plurality of second switches are formed of electric circuit elements. The plurality of first switches and the plurality of second switches are provided in parallel. The first switch is also referred to as a weak-power switch (W-PSW), for example. The second switch is also referred to as a strong-power switch (S-PSW), for example. The S-PSW has a larger circuit layout compared to the W-PSW. Therefore, a larger current can flow through the S-PSW than the current flowing through the W-PSW. In the present embodiment, when W-PSWs and S-PSWs are not distinguished, the W-PSWs and S-PSWs are simply described as switches PSW. In the present embodiment, n W-PSWs (n is a natural number of 1 or more) are provided. Further, m S-PSWs (m is a natural number of 1 or more) are provided. Further, in the present embodiment, the switch circuit 400 includes 80 switches PSW. The number of switches PSW is not limited to 80. It is noted that the switch circuit 400 is not limited to the first switch and the second switch, and may include a plurality of types of switches allowing a different amount of current to flow (hereinafter referred to as "allowable current amounts"). Further, the switch circuit 400 may include only switches having one type of allowable current amount.

Each switch PSW of the switch circuit 400 is controlled on and off by the switch control circuit 240. When all the switches PSW are on, the semiconductor device 1 is in the active state. When all the switches PSW are off, the semiconductor device 1 is in the standby state. Therefore, by switching on and off each switch PSW of the switch circuit 400, it is possible to switch between the standby state and the active state of the semiconductor device 1.

When switching between the standby state and the active state of the semiconductor device 1, the current flowing through the switch circuit 400 changes abruptly if all the switches PSW of the switch circuit 400 are switched simultaneously. The regulator 100 cannot follow such a sudden change in current and may not be able to supply a stable power source voltage. In the present embodiment, "stable power source voltage" means a voltage with a fluctuation amount that is within a threshold value. Meanwhile, the shorter the time for switching on and off the switch PSW is, the shorter the operating time of the semiconductor device 1 can be. That is, as the time for switching between the standby state and the active state of the semiconductor device 1 (also referred to as a "state switching time") is shorter, the operating time of the semiconductor device 1 can be shorter. In the semiconductor device 1 according to the present embodiment, when the standby state is switched to the active state, a plurality of W-PSWs are switched on in order, and after the plurality of W-PSWs are all switched on, a plurality of S-PSWs are switched on in order.

The number of switches PSW that can be switched simultaneously while the regulator 100 supplies the stable power source voltage depends on the performance of the switches PSW. The performance of the switches PSW is, for example, durability and current stability during on-off switching. For example, when the switch PSW is a transistor, the performance of the switch may vary depending on a thickness of a gate insulating film, a gate length, a drain current, and on-voltage. Further, there is a possibility that variation may occur due to the operating environment of the switch PSW. Therefore, in the present embodiment, for example, the number of S-PSWs that can be switched simultaneously while the regulator 100 supplies the stable power source voltage to each semiconductor device 1 is measured before shipment. The measurement result is set as a parameter. The parameter is natural number. In addition, the parameters are set at the time of manufacturing the semiconductor device 1, for example. The parameters may be set at the time of designing the semiconductor device 1. If there are multiple parameters that can be set, the parameters may be set based on the required switching time between the standby and active states. The smaller the variation in the performance of the switches PSW, the larger the number of parameters may be. The larger the drain current, the smaller the number of parameters may be. However, it is not limited to the above case if the regulator can follow the changing current. The firmware and parameters related to the control of the switch control circuit 240 may be stored together or separately.

The parameters include a first parameter and a second parameter. In one embodiment, the first parameter is p1 (p1 is natural number). The second parameter is p2 (p2 is natural number). For example, the first parameter is an initial value. In the present embodiment, the initial value is 1. That is, p1 is 1. For example, the second parameter is a value based on the measurement result before shipment. In the semiconductor device 1 according to the present embodiment, when there are two S-PSWs that can be switched simultaneously while the regulator 100 supplies the stable power source voltage, the second parameter is set to 2, for example. In other words, p2 is 2. That is, the second parameter is set based on the performance of the switches PSW. The first or second parameter may be set based on the measurement result at the time of designing or manufacturing the semiconductor device 1. At least one of p1 or p2 is greater than or equal to 2.

Figure 2:
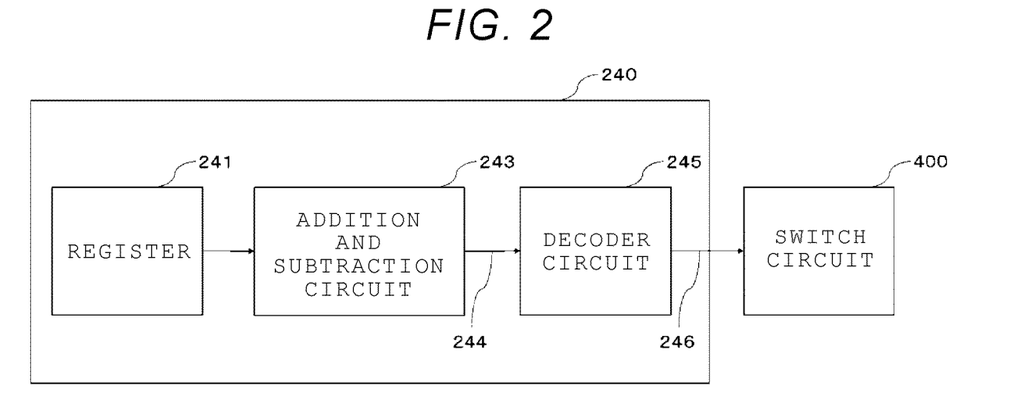
FIG. 2 is a block diagram illustrating an example of a connection between a switch control circuit and a switch circuit according to the first embodiment.

Configurations and operations of the switch control circuit 240 and the switch circuit 400 will be described with reference to FIGS. 2 to 6. FIG. 2 is a block diagram illustrating an example of a connection between a switch control circuit and a switch circuit according to the first embodiment.

The switch control circuit 240 includes a register 241, an addition and subtraction circuit 243, and a decoder circuit 245.

The register 241 stores parameters by processing according to the firmware related to the control of the switch control circuit 240. The register 241 can provide the stored parameters to the addition and subtraction circuit 243.

The addition and subtraction circuit 243 acquires the parameter stored in the register 241. The addition and subtraction circuit 243 calculates a counter value based on the parameter acquired from the register 241. When the semiconductor device 1 is changed from the standby state to the active state, the addition and subtraction circuit 243 adds a value of the acquired parameter. When the semiconductor device 1 is changed from the active state to the standby state, the addition and subtraction circuit 243 subtracts the value of the acquired parameter. The addition and subtraction circuit 243 outputs the counter value. In the present embodiment, a case when the semiconductor device 1 is changed from the standby state to the active state will be described.

Figure 3:
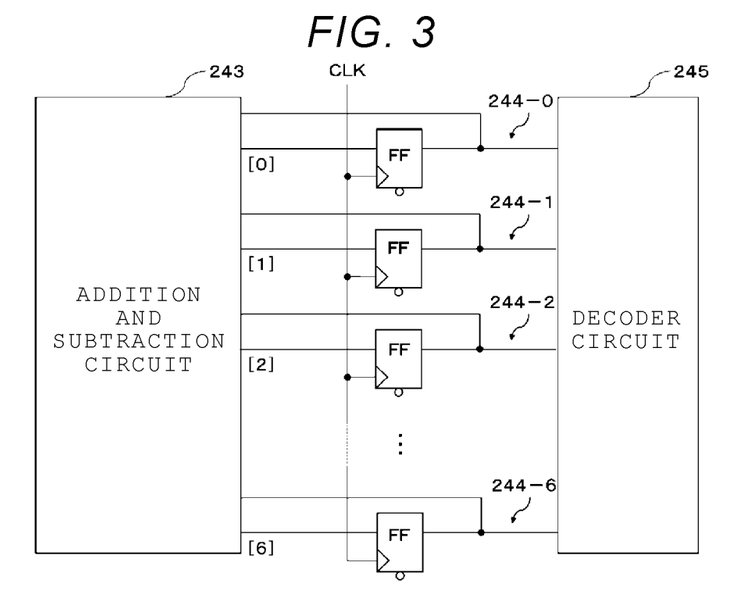
FIG. 3 is a block diagram illustrating an example of a connection between an addition and subtraction circuit and a decoder circuit according to the first embodiment.

The addition and subtraction circuit 243 and the decoder circuit 245 are connected to each other by a signal line 244. Hereinafter, an example of a connection between the addition and subtraction circuit 243 and the decoder circuit 245 will be described. FIG. 3 is a block diagram illustrating an example of a connection between the addition and subtraction circuit and the decoder circuit according to the first embodiment. As illustrated in FIG. 3, the signal line 244 includes a plurality of signal lines 244-0 to 244-6. The addition and subtraction circuit 243 outputs the counter value calculated based on the parameter stored in and acquired from the register 241 to the signal lines 244-0 to 244-6. In the present embodiment, the number of switches PSW is 80, and the number of switches PSW can be represented by 7 digits of a binary number. Therefore, seven signal lines 244 are required, which are signal lines 244-0 to 244-6. A plurality of flip-flop circuits FF are provided between the addition and subtraction circuit 243 and the decoder circuit 245.

Each flip-flop circuit FF receives the counter value output from the addition and subtraction circuit 243 and a clock CLK. Each flip-flop circuit FF synchronizes the received counter value with the clock CLK, and outputs the counter value synchronized with the clock CLK. The counter value synchronized with the clock CLK is input to the decoder circuit 245. Further, the counter value synchronized with the clock CLK is fed back to the addition and subtraction circuit 243. The addition and subtraction circuit 243 calculates the counter value again in response to the feedback of the count value synchronized with the clock CLK. That is, in the present embodiment, a value obtained by adding the value of the parameter to the feedback counter value is a next counter value. As a result, the counter value is updated. In the present embodiment, an initial value of the counter value is 0. For example, when the first parameter ("p1=1" in this example) is used as the parameter, the counter value is updated to 0, 1, 2, . . . , 80. The addition and subtraction circuit 243, and a plurality of flip-flop circuits FF provided between the addition and subtraction circuit 243 and the decoder circuit 245 may be collectively referred to as a counter circuit.

Figure 4:
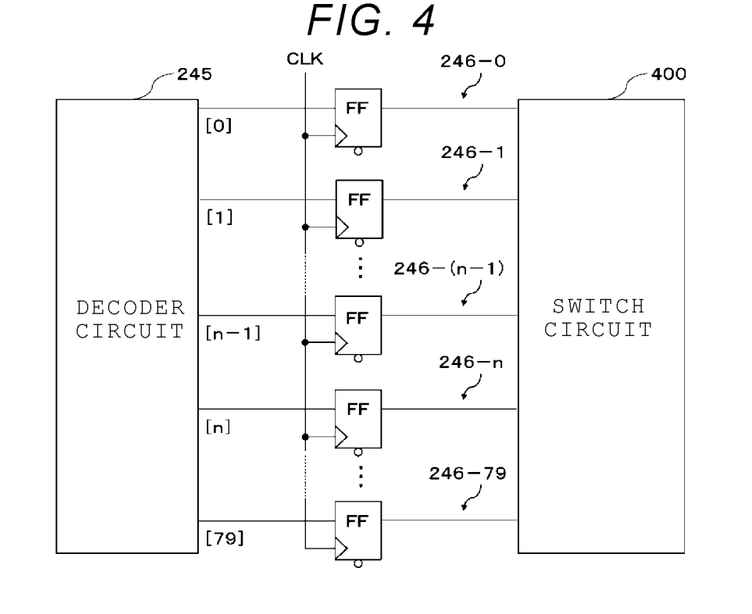
FIG. 4 is a block diagram illustrating an example of a connection between the decoder circuit and the switch circuit according to the first embodiment.

The decoder circuit 245 decodes the counter value input from the addition and subtraction circuit 243 via the plurality of flip-flop circuits FF to a value corresponding to each switch PSW. The decoder circuit 245 outputs the decoded value. As illustrated in FIG. 2, the decoder circuit 245 and the switch circuit 400 are connected to each other by a switch control line 246. Hereinafter, an example of a connection between the decoder circuit 245 and the switch circuit 400 will be described. FIG. 4 is a block diagram illustrating an example of a connection between the decoder circuit and the switch circuit according to the first embodiment. As illustrated in FIG. 4, the switch control line 246 includes switch control lines 246-0 to 246-79. The decoder circuit 245 outputs the decoded value to the switch control lines 246-0 to 246-79. Each of the switch control lines 246-0 to 246-79 is connected to a corresponding switch PSW, respectively, as will be described below. In the present embodiment, since the number of switches PSW is 80, 80 switch control lines 246-0 to 246-79 are required for the switch control line 246. The plurality of flip-flop circuits FF are provided between the decoder circuit 245 and the switch circuit 400. Each of the flip-flop circuits FF receives the value output from the decoder circuit 245 and the clock CLK. Each of the flip-flop circuits FF synchronizes the value received from the decoder circuit 245 with the clock CLK, and outputs the value synchronized with the clock CLK.

Figure 5:
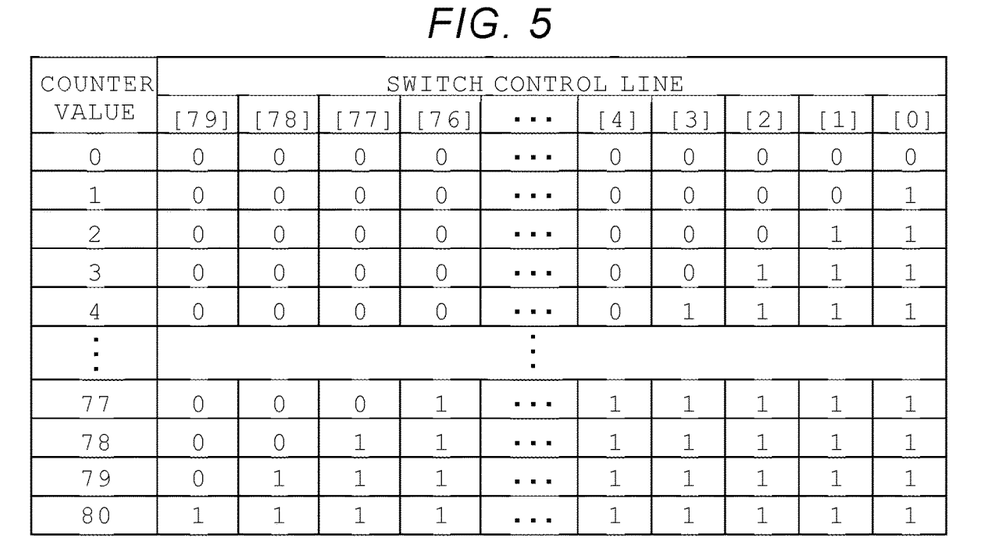
FIG. 5 is a table showing a correspondence between counter values and input values to a switch control line, according to the first embodiment.

The value decoded by the decoder circuit 245 is an input value to the switch control line 246. The counter value and the input value to the switch control line 246 are associated with each other as illustrated in FIG. 5, for example. FIG. 5 is a table illustrating the correspondence between the counter values and the input values to the switch control line according to the first embodiment. For example, when 0 is input as the initial value of the counter value, the decoder circuit 245 decodes the counter value of 0 and outputs 0 to all the switch control lines 246. When the subsequently updated counter value is 1, the decoder circuit 245 decodes the counter value of 1, outputs 1 to the switch control line 246-0, and outputs 0 to the switch control lines 246-1 to 246-79. The input value to the switch control line 246 output from the decoder circuit 245 is synchronized with the clock CLK by the plurality of flip-flop circuits FF, and is input to the switch circuit 400.

Figure 6:
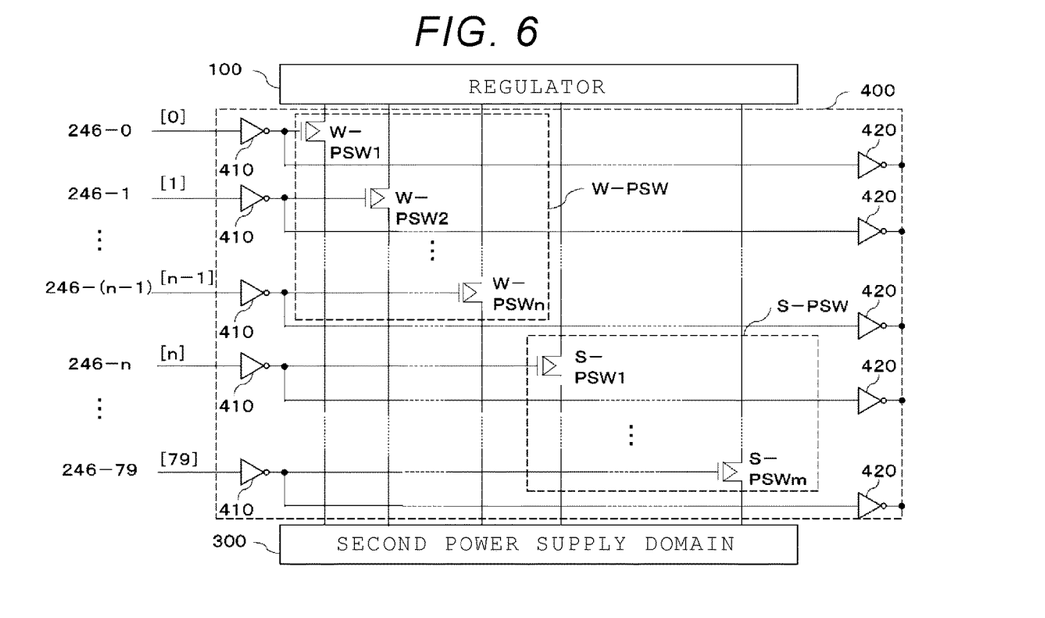
FIG. 6 is a circuit diagram illustrating an example of the switch circuit according to the first embodiment.

FIG. 6 is a circuit diagram illustrating an example of the switch circuit according to the first embodiment. As illustrated in FIG. 6, the switch circuit 400 includes an inverter gate 410, a plurality of switches PSW, and an inverter gate 420. The W-PSW includes n switches (W-PSW1 to W-PSWn). The S-PSW includes m switches (S-PSW1 to S-PSWm). One end of each switch PSW is connected to the regulator 100. The other end of each switch PSW is connected to the second power supply domain 300. The switch control lines 246-0 to 246-79 are connected to the corresponding switches PSW and the inverter gates 420, respectively, via the inverter gates 410.

Each of the plurality of switches PSW is a transistor, for example. In the present embodiment, the switch PSW is a PMOS transistor. A gate of each transistor, which is the switch PSW, is connected to the corresponding switch control line 246. A source of each transistor, which is the switch PSW, is connected to the regulator 100. A drain of each transistor, which is the switch PSW, is connected to the second power supply domain 300. Specifically, the gate of W-PSW1 is connected to the switch control line 246-0. The gate of W-PSW2 is connected to the switch control line 246-1. The gate of W-PSWn is connected to the switch control line 246-(n−1). The gate of S-PSW1 is connected to the switch control line 246-n. The gate of S-PSWm is connected to the switch control line 246-79. Further, an output of each inverter gate 410 is input to the inverter gate 420 via the corresponding switch control line 246. When a circuit (not illustrated) having the same configuration as that of the switch circuit 400 is connected in parallel with the switch circuit 400 for a power supply domain different from the second power supply domain 300, an output of each inverter gate 420 of the switch circuit 400 may be input to each inverter gate of the circuit having the same configuration as that of the switch circuit 400.

When a value output to the switch control line 246 is 0, the corresponding switch PSW is off. When the switch PSW is off, the power source voltage is not supplied from the regulator 100 to the second power supply domain 300. When the value output to the switch control line 246 is 1, the corresponding switch PSW is on. When the switch PSW is on, the power source voltage is supplied from the regulator 100 to the second power supply domain 300. That is, it is possible to switch on and off the switch PSW according to the input value to the switch control line 246 output from the decoder circuit 245. That is, the switch control circuit 240 can control the switches PSW based on the parameters.

Figure 7:
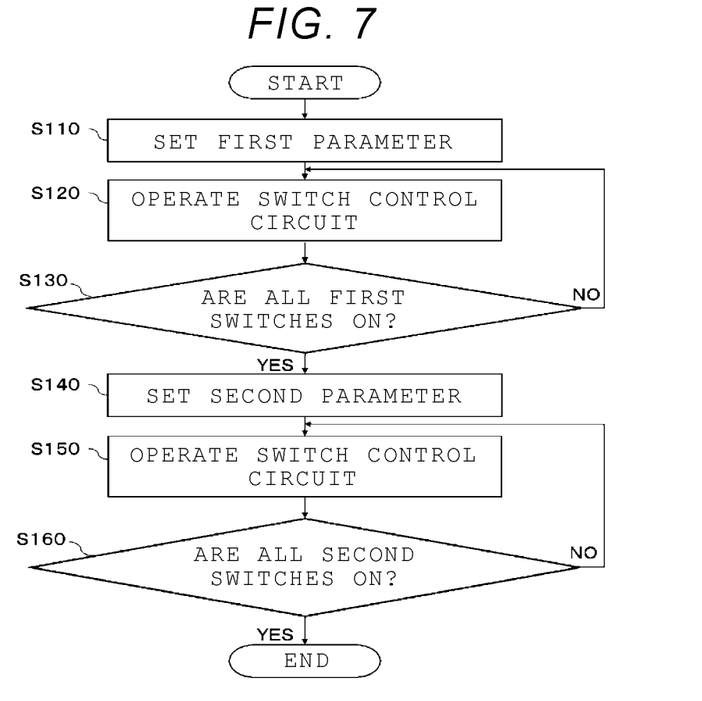
FIG. 7 is a flowchart of state switching control of the semiconductor integrated circuit according to the first embodiment.

FIG. 7 is a flowchart of state switching control of the semiconductor integrated circuit according to the first embodiment. The state switching control for switching the semiconductor device 1 from the standby state to the active state will be described with reference to FIG. 7.

The control circuit 210 executes the firmware related to the control of the switch control circuit 240 stored in the RAM 230. The control circuit 210 sets a first parameter of the plurality of parameters in the register 241 according to the firmware related to the control of the switch control circuit 240 (S110). It is noted that when the first parameter is already set in the register 241, S110 may not be performed.

The control circuit 210 operates the switch control circuit 240 according to the setting of the first parameter (S120). The switch control circuit 240 switches on the W-PSWs one by one based on the first parameter when the first parameter is 1, for example. That is, the switch control circuit 240 switches the W-PSWs from off to on by the unit of the number set as the first parameter.

The control circuit 210 checks whether all the n W-PSWs (also referred to herein as "first switches") of the switch circuit 400 are on (S130). When not all the W-PSWs are on (S130; NO), the process returns to S120.

When all the W-PSWs are on (S130; YES), the control circuit 210 sets a second parameter of the parameters in the register 241 according to the firmware related to the control of the switch control circuit 240 (S140). That is, the parameter is changed during a period of time in which the switches PSW are sequentially switched from off to on.

The control circuit 210 operates the switch control circuit 240 according to the setting of the second parameter (S150). The switch control circuit 240 switches on the S-PSWs two by two based on the second parameter when the second parameter is 2, for example. That is, the switch control circuit 240 switches the S-PSWs from off to on by the unit of the number set as the second parameter.

The control circuit 210 checks whether all the m S-PSWs (also referred to herein as "second switches") of the switch circuit 400 are on (S160). When not all the S-PSWs are on (S160; NO), the process returns to S150. When all the S-PSWs are on (S160; YES), all the switches PSW are switched on, and the semiconductor device 1 is in the active state. As described above, the state switching control for switching the semiconductor device 1 from the standby state to the active state is completed.

In the present embodiment, when all the W-PSWs are on (S130; YES), the control circuit 210 sets the second parameter of the parameters in the register 241 according to the firmware related to the control of the switch control circuit 240 (S140), but embodiments are not limited thereto. For example, the control circuit 210 may set the first parameter of the plurality of parameters in the register 241 (S110) and then set the second parameter in the register 241 (S140) according to the firmware related to the control of the switch control circuit 240.

Figure 8:
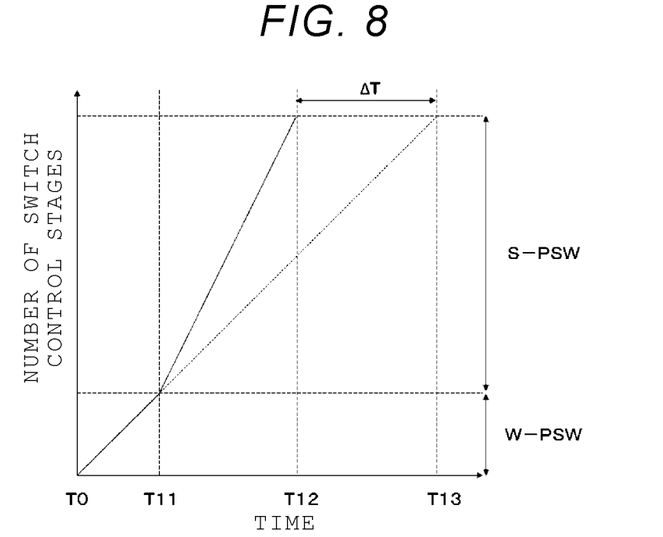
FIG. 8 is a graph illustrating a relationship between the number of switch control stages and time according to the first embodiment.

FIG. 8 is a graph illustrating a relationship between the number of switch control stages and time according to the first embodiment. The number of switch control stages is the number of switches PSW that are on. The solid line represents the state switching control of the present embodiment.

At T0, the semiconductor device 1 starts switching from the standby state to the active state. First, based on the first parameter of 1 ("p1=1" in this example), the W-PSWs are switched on one by one. At T11, all the W-PSWs are switched on. Then, based on the second parameter of 2 ("p2=2" in this example), the S-PSWs are switched on two by two. At T12, all the S-PSWs are switched on.

Effects

The dotted line shown in FIG. 8 represents a case when the state switching control of a comparative example is performed. The comparative example is an example in which the performance of the S-PSWs of the switch circuit 400 is not measured before shipment. In such a comparative example, for example, the S-PSWs are switched on one by one such that the stable power source voltage can be supplied from the regulator 100. In a case of the state switching control of the comparative example, at T13, all the switches PSW are switched on. Therefore, in the present embodiment, it is possible to switch from the standby state to the active state faster than the comparative example by ΔT.

As described above, according to the present embodiment, the performance of the S-PSWs is measured, and the parameter related to the supply of the power source voltage is set based on the measurement result, so that it is possible to continuously supply the stable power source voltage from the regulator 100. In addition, by setting parameters in accordance with the performance of the S-PSWs, it is possible to switch on the plurality of S-PSWs simultaneously. That is, it is possible to further shorten a state switching time of the semiconductor device 1 while supplying the stable power source voltage from the regulator 100.

Second Embodiment

The semiconductor integrated circuit according to a second embodiment will be described with reference to FIG. 9. The second embodiment is different from the first embodiment in that parameters are set for the W-PSWs in addition to the S-PSWs based on the measurement results. Hereinafter, the differences from the first embodiment will be mainly described.

In the present embodiment, for example, the number of W-PSWs and S-PSWs that can be switched simultaneously while the regulator 100 supplies the stable power source voltage to each semiconductor device 1 is measured before shipment. The measurement result is set as a parameter to be processed by the firmware related to the control of the switch control circuit 240. In the present embodiment, the first parameter as well as the second parameter is a value based on the performance of the switches PSW.

In the semiconductor device 1 according to the present embodiment, when there are two W-PSWs that can be switched simultaneously while the regulator 100 supplies the stable power source voltage, the first parameter is set to 2, for example. Further, when there are three S-PSWs that can be switched simultaneously while the regulator 100 supplies the stable power source voltage, the second parameter is set to 3, for example.

Figure 9:
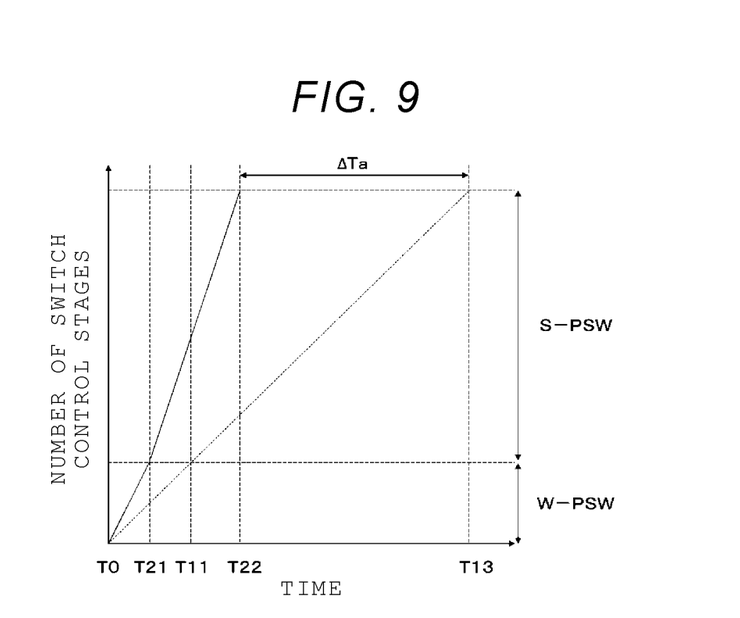
FIG. 9 is a graph illustrating a relationship between the number of switch control stages and time according to a second embodiment.

FIG. 9 is a graph illustrating a relationship between the number of switch control stages and the time according to the second embodiment. The solid line represents the case when the state switching control of the present embodiment is performed. The dotted line represents the case when the state switching control of the comparative example is performed.

In the comparative example, the performance of the switches PSW of the switch circuit 400 is not measured before shipment. Therefore, for example, the switches PSW are switched on one by one such that the stable power source voltage can be supplied from the regulator 100. In the case of the state switching control of the comparative example, at T13, all the switches PSW are switched on.

Meanwhile, in the present embodiment, first, based on the first parameter of 2 ("p1=2" in this example), the W-PSWs are switched on two by two. At T21, all the W-PSWs are switched on. Then, based on the second parameter of 3 ("p2=3" in this example), the S-PSWs are switched on three by three. At T22, all the S-PSWs are switched on. Therefore, in the present embodiment, it is possible to switch from the standby state to the active state faster than the comparative example by ΔTa. ΔTa in the present embodiment is a longer period of time than ΔT in the first embodiment.

Effects

According to the present embodiment, the same effects as those of the first embodiment can be achieved. Further, by turning on not only the S-PSWs but also the W-PSWs based on the first parameter based on the measurement result, it is possible to further shorten the state switching time of the semiconductor device 1 as compared with the first embodiment.

Third Embodiment

The semiconductor integrated circuit according to a third embodiment will be described with reference to FIGS. 10 and 11. The third embodiment is different from the first embodiment in that the parameters are changed according to the preset number of switches PSW. Hereinafter, the differences from the first embodiment will be mainly described.

In the present embodiment, for example, the number of switches PSW that can be switched simultaneously while the regulator 100 supplies the stable power source voltage to each semiconductor device 1 is measured before shipment. The measurement result is set as a parameter to be processed by the firmware related to the control of the switch control circuit 240. In the present embodiment, the first parameter and the second parameter are values based on the measurement results.

In the present embodiment, among the n W-PSWs, x W-PSWs (x is a natural number with 1≤x<n), that is, W-PSW1 to W-PSWx can be switched simultaneously three by three while the regulator 100 supplies the stable power source voltage. Further, in the present embodiment, since the number of PSW is 80, the 80−x switches PSW, that is, W-PSW(x+1) to S-PSWm can be switched simultaneously two by two while the regulator 100 supplies the stable power source voltage. In this case, when the first parameter is 3, for example, the second parameter is 2, for example.

Figure 10:
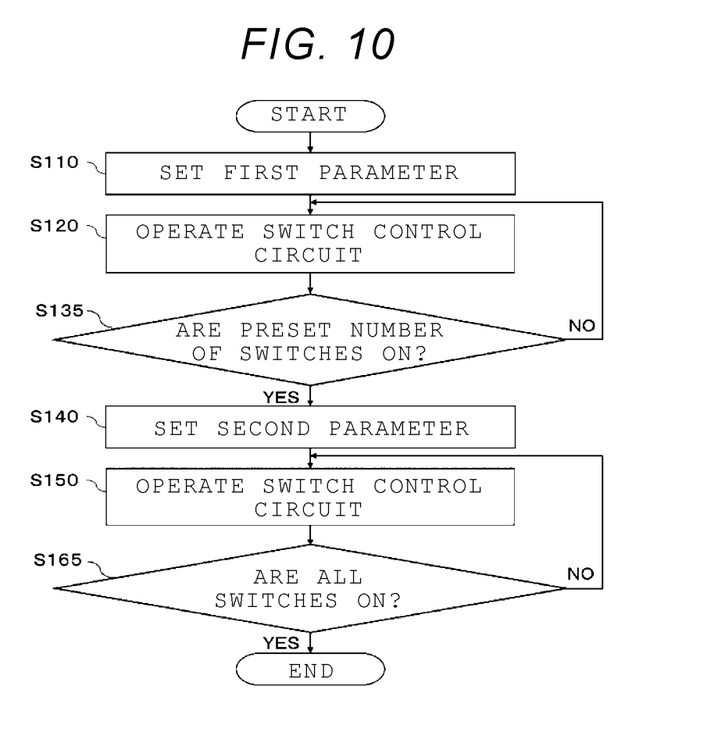
FIG. 10 is a flowchart of state switching control of a semiconductor integrated circuit according to a third embodiment.

FIG. 10 is a flowchart of state switching control of a semiconductor integrated circuit according to a third embodiment. The state switching control for switching the semiconductor device 1 from the standby state to the active state will be described with reference to FIG. 10.

S110 and S120 are the same as those in the first embodiment. The control circuit 210 checks whether the preset number of switches PSW in the switch circuit 400 are on (S135). In the present embodiment, the control circuit 210 checks whether the x W-PSWs are on. When the preset number of switches PSW are not on (S135; NO), the process returns to S120.

When the preset number of switches PSW are on (S135; YES), the process proceeds to S140. S140 and S150 are the same as those in the first embodiment. In the present embodiment, in S150, (80−x) switches PSW, that is, W-PSW (x+1) to S-PSWm are on.

The control circuit 210 checks whether all the switches PSW of the switch circuit 400 are on (S165). When not all the switches PSW are on (S165; NO), the process returns to S150. When all the switches PSW are on (S165; YES), all the switches PSW are switched on, and the semiconductor device 1 is in the active state. As described above, the state switching control for switching the semiconductor device 1 from the standby state to the active state is completed.

Figure 11:
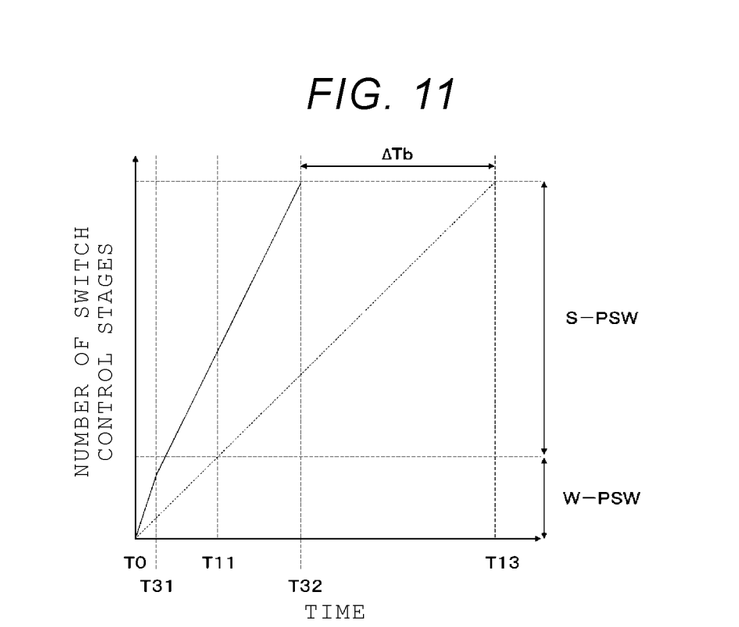
FIG. 11 is a graph illustrating a relationship between the number of switch control stages and time according to the third embodiment.

FIG. 11 is a graph illustrating a relationship between the number of switch control stages and time according to the third embodiment. The solid line represents the case when the state switching control of the present embodiment is performed. The dotted line represents the case when the state switching control of the comparative example is performed.

In the comparative example, the performance of the switches PSW of the switch circuit 400 is not measured before shipment. Therefore, for example, the switches PSW are switched on one by one such that the stable power source voltage can be supplied from the regulator 100. In the case of the state switching control of the comparative example, at T13, all the switches PSW are switched on.

Meanwhile, in the present embodiment, first, based on the first parameter of 3 ("p1=3" in this example), the W-PSWs are switched on three by three. At T31, all of the preset number of switches PSW are switched on. Then, based on the second parameter of 2 ("p2=2" in this example), the switches PSW not yet switched on are switched on two by two. At T32, all the switches PSW are switched on. Therefore, in the present embodiment, it is possible to switch to the active state faster than the comparative example by ΔTb. ΔTb in the present embodiment is a longer period of time than ΔT in the first embodiment.

Effects

According to the present embodiment, the same effects as those of the first embodiment can be achieved. Further, instead of changing the parameters using the S-PSWs and the W-PSWs, it is possible to change the parameters using the number of switches PSW. That is, the timing of changing the parameter can be optimized in accordance with the performance of the switches PSW. Therefore, as compared with the first embodiment, it is possible to perform the state switching control more suitably for the semiconductor device 1.

Fourth Embodiment

The semiconductor integrated circuit according to a fourth embodiment will be described with reference to FIGS. 12 and 13. The fourth embodiment is different from the first embodiment in that the semiconductor device 1 is switched from the active state to the standby state. Hereinafter, the differences from the first embodiment will be mainly described.

When switching the semiconductor device 1 from the active state to the standby state, the semiconductor device 1 according to the present embodiment switches off the plurality of S-PSWs in order, switches off all of the plurality of S-PSWs, and then switches off the plurality of W-PSWs in order.

In the present embodiment, the parameters include a third parameter and a fourth parameter. The third parameter is p3 (p3 is natural number). The fourth parameter is p4 (p4 is natural number). For example, the third parameter is a value based on the measurement result before shipment. In the semiconductor device 1 according to the present embodiment, when there are two S-PSWs that can be switched simultaneously while the regulator 100 supplies the stable power source voltage, the third parameter is set to 2, for example. In the other word, p3 is 2. That is, the third parameter is set based on the performance of the switches PSW. For example, the fourth parameter is an initial value. In the present embodiment, the initial value is 1. That is, p4 is 1. The parameters for changing from the standby state to the active state and for changing from the active state to the standby state may be the same. At least one of p3 or p4 is greater than or equal to 2.

In the present embodiment, in order to change the semiconductor device 1 from the active state to the standby state, the initial value of the counter value is 80, for example. The addition and subtraction circuit 243 subtracts the value of the parameter stored in the register 241.

Figure 12:
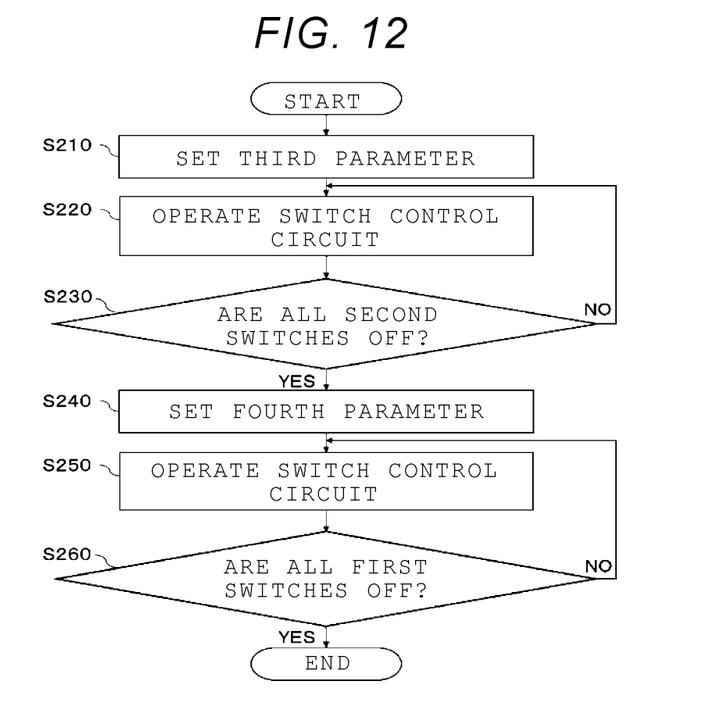
FIG. 12 is a flowchart of state switching control of a semiconductor integrated circuit according to a fourth embodiment.

FIG. 12 is a flowchart of state switching control of a semiconductor integrated circuit according to the fourth embodiment. The state switching control for switching the semiconductor device 1 from the active state to the standby state will be described with reference to FIG. 12.

The control circuit 210 executes the firmware related to the control of the switch control circuit 240 stored in the RAM 230. The control circuit 210 sets a third parameter of the plurality of parameters in the register 241 according to the firmware related to the control of the switch control circuit 240 (S210).

The control circuit 210 operates the switch control circuit 240 according to the setting of the third parameter (S220). The switch control circuit 240 switches off the S-PSWs two by two based on the third parameter. That is, the switch control circuit 240 switches the S-PSW from on to off by the unit of the number set as the third parameter.

The control circuit 210 checks whether all the m S-PSWs of the switch circuit 400 are off (S230). When not all the S-PSWs are off (S230; NO), the process returns to S220.

When all the S-PSWs are off (S230; YES), the control circuit 210 sets the fourth parameter of the parameters in the register 241 according to the firmware related to the control of the switch control circuit 240 (S240). That is, the parameters are changed during a period of time in which the switches PSW are sequentially switched from on to off.

The control circuit 210 operates the switch control circuit 240 according to the setting of the fourth parameter (S250). The switch control circuit 240 switches off the W-PSWs one by one based on the fourth parameter. That is, the switch control circuit 240 switches the W-PSW from on to off by the unit of the number set as the fourth parameter.

The control circuit 210 checks whether all the n W-PSWs of the switch circuit 400 are off (S260). When not all the W-PSWs are off (S260; NO), the process returns to S250. When all the W-PSWs are off (S260; YES), all the switches PSW are switched off, and the semiconductor device 1 is in the standby state. As described above, the state switching control for switching the semiconductor device 1 from the active state to the standby state is completed.

In the present embodiment, when all the S-PSWs are off (S230; YES), the control circuit 210 sets the third parameter of the parameters in the register 241 according to the firmware related to the control of the switch control circuit 240 (S240), but embodiments are not limited thereto. For example, the control circuit 210 may set the third parameter of the plurality of parameters in the register 241 (S210) and then set the fourth parameter in the register 241 (S240) according to the firmware related to the control of the switch control circuit 240.

Figure 13:
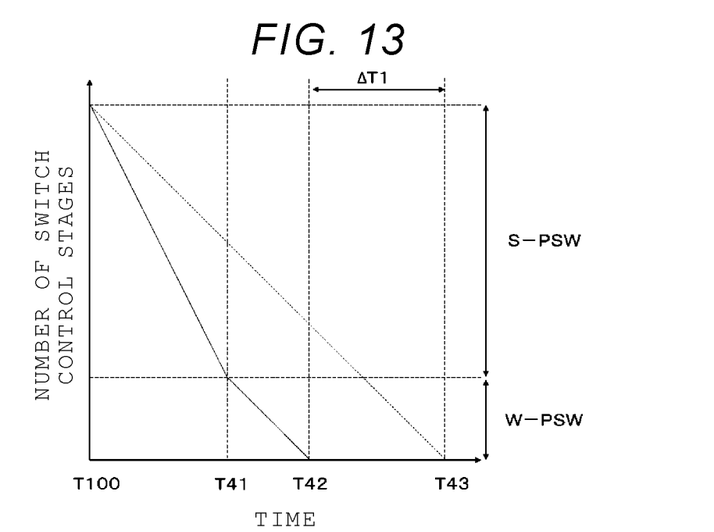
FIG. 13 is a graph illustrating a relationship between the number of switch control stages and time according to the fourth embodiment.

FIG. 13 is a graph illustrating a relationship between the number of switch control stages and time according to the fourth embodiment. The number of switch control stages is the number of switches PSW that are on. The solid line represents the case when the state switching control of the present embodiment is performed.

At T100, the semiconductor device 1 starts switching from the active state to the standby state. First, based on the third parameter of 2 ("p3=2" in this example), the S-PSWs are switched off two by two. At T41, all the S-PSWs are switched off. Then, based on the fourth parameter of 1 ("p4=2" in this example), the W-PSWs are switched off one by one. At T42, all the W-PSWs are switched off.

Effects

The dotted line shown in FIG. 13 represents the case when the state switching control of the comparative example is performed. The comparative example is the example in which the performance of the S-PSWs of the switch circuit 400 is not measured before shipment. In such a comparative example, for example, the S-PSWs are switched off one by one such that the stable power source voltage can be supplied from the regulator 100. In the case of the state switching control of the comparative example, at T43, all the switches PSW are switched off. Therefore, in the present embodiment, it is possible to switch from the active state to the standby state faster than the comparative example by ΔT1.

As described above, according to the present embodiment, even when the semiconductor device 1 is switched from the active state to the standby state, the same effects as those of the first embodiment can be obtained. Further, since the present embodiment can switch to the standby state faster than the comparative example by ΔT1, power consumption of the semiconductor device 1 can be further reduced.

Fifth Embodiment

The semiconductor integrated circuit according to a fifth embodiment will be described with reference to FIG. 14. The fifth embodiment is different from the fourth embodiment in that parameters are set for the W-PSWs in addition to the S-PSWs based on the measurement results. Hereinafter, the differences from the fourth embodiment will be mainly described.

In the present embodiment, for example, the number of W-PSWs and S-PSWs that can be switched simultaneously while the regulator 100 supplies the stable power source voltage to each semiconductor device 1 is measured before shipment. The measurement result is set as a parameter. In the present embodiment, the third parameter as well as the fourth parameter is the value based on the performance of the switches PSW.

In the semiconductor device 1 according to the present embodiment, when there are three S-PSWs that can be switched simultaneously while the regulator 100 supplies the stable power source voltage, the third parameter is set to 3, for example. Further, when there are two W-PSWs that can be switched simultaneously while the regulator 100 supplies the stable power source voltage, the fourth parameter is set to 2, for example.

Figure 14:
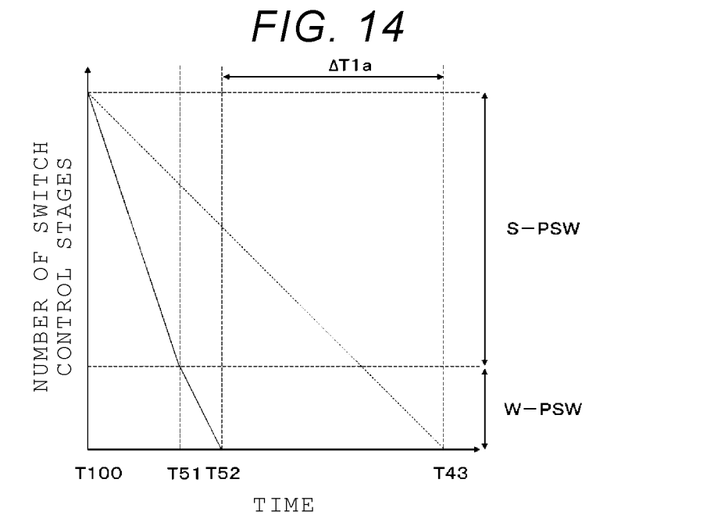
FIG. 14 is a graph illustrating a relationship between the number of switch control stages and time according to a fifth embodiment.

FIG. 14 is a graph illustrating a relationship between the number of switch control stages and time according to the fifth embodiment. The solid line represents the case when the state switching control of the present embodiment is performed. The dotted line represents the case when the state switching control of the comparative example is performed.

In the comparative example, the performance of the switches PSW of the switch circuit 400 is not measured before shipment. Therefore, for example, the switches PSW are switched off one by one such that the stable power source voltage can be supplied from the regulator 100. In the case of the state switching control of the comparative example, at T43, all the switches PSW are switched off.

Meanwhile, in the present embodiment, first, based on the third parameter of 3 ("p3=3" in this example), the S-PSWs are switched off three by three. At T51, all the S-PSWs are switched off. Then, based on the fourth parameter of 2 ("p4=2" in this example), the W-PSWs are switched off two by two. At T52, all the W-PSWs are switched off. Therefore, in the present embodiment, it is possible to switch from the active state to the standby state faster than the comparative example by ΔT1a. ΔT1a in the present embodiment is a longer period of time than ΔT1 in the fourth embodiment.

Effects

According to the present embodiment, the same effects as those of the fourth embodiment can be achieved. Further, by turning off not only the S-PSWs but also the W-PSWs based on the fourth parameter based on the measurement result, it is possible to further reduce the power consumption of the semiconductor device 1 as compared with the fourth embodiment.

Sixth Embodiment

The semiconductor integrated circuit according to a sixth embodiment will be described with reference to FIGS. 15 and 16. The sixth embodiment is different from the fourth embodiment in that the parameters are changed according to the preset number of switches PSW. Hereinafter, the differences from the fourth embodiment will be mainly described.

In the present embodiment, for example, the number of switches PSW that can be switched simultaneously while the regulator 100 supplies the stable power source voltage to each semiconductor device 1 is measured before shipment. The measurement result is set as a parameter. In the present embodiment, the third parameter and the fourth parameter are values based on the measurement results.

In the present embodiment, y S-PSWs (y is a natural number with 1≤y<m), that is, S-PSWm to S-PSWy can be switched simultaneously two by two while the regulator 100 supplies the stable power source voltage. Further, in the present embodiment, since the number of PSW is 80, (80−y) switches PSW, that is, S-PSW(y−1) to W-PSW1 can be switched simultaneously three by three while the regulator 100 supplies the stable power source voltage. In this case, when the third parameter is 2, for example, the fourth parameter is 3, for example.

Figure 15:
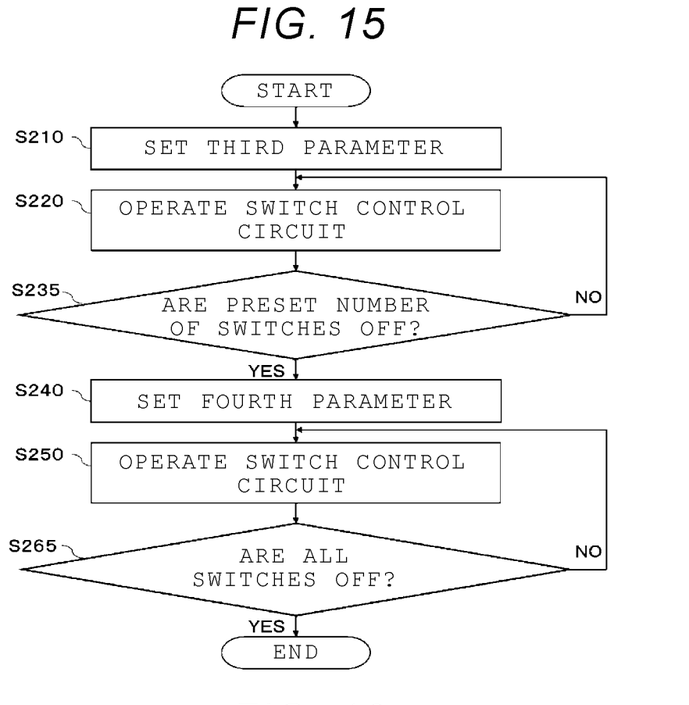
FIG. 15 is a flowchart of state switching control of a semiconductor integrated circuit according to a sixth embodiment.

FIG. 15 is a flowchart of state switching control of a semiconductor integrated circuit according to the sixth embodiment. The state switching control for switching the semiconductor device 1 from the active state to the standby state will be described with reference to FIG. 15.

S210 and S220 are the same as those in the fourth embodiment. The control circuit 210 checks whether the preset number of switches PSW in the switch circuit 400 are off (S235). In the present embodiment, the control circuit 210 checks whether the y S-PSWs are off. When the preset number of switches PSW are not off (S235; NO), the process returns to S220.

When the preset number of switches PSW are off (S235; YES), the process proceeds to S240. S240 and S250 are the same as those in the fourth embodiment.

The control circuit 210 checks whether all the switches PSW of the switch circuit 400 are off (S265). When not all the switches PSW are off (S265; NO), the process returns to S250. When all the switches PSW are off (S265; YES), all the switches PSW are switched off, and the semiconductor device 1 is in the standby state. As described above, the state switching control for switching the semiconductor device 1 from the active state to the standby state is completed.

Figure 16:
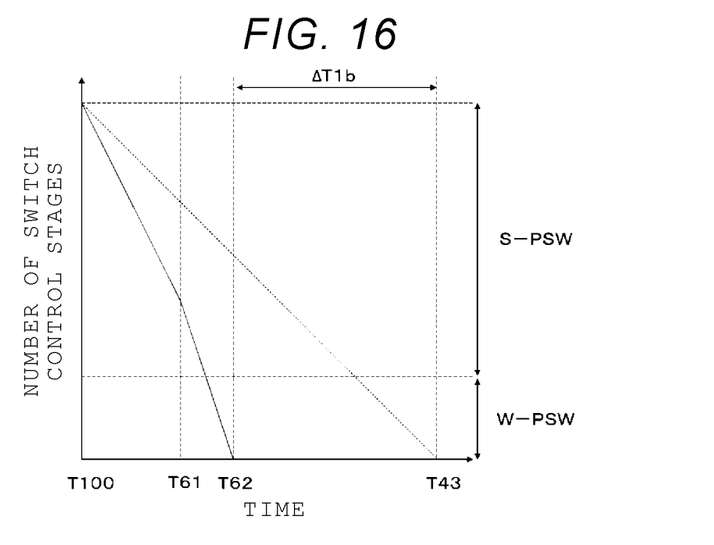
FIG. 16 is a graph illustrating a relationship between the number of switch control stages and time according to the sixth embodiment.

FIG. 16 is a graph illustrating a relationship between the number of switch control stages and time according to the sixth embodiment. The solid line represents the case when the state switching control of the present embodiment is performed. The dotted line represents the case when the state switching control of the comparative example is performed.

In the comparative example, the performance of the switches PSW of the switch circuit 400 is not measured before shipment. Therefore, for example, the switches PSW are switched off one by one such that the stable power source voltage can be supplied from the regulator 100. In the case of the state switching control of the comparative example, at T43, all the switches PSW are switched off.

Meanwhile, in the present embodiment, first, based on the third parameter of 2 ("p3=2" in this example), the S-PSWs are switched off two by two. At T61, all of the preset number of switches PSW are switched off. Then, based on the fourth parameter of 3 ("p4=3" in this example), the switches PSW not yet switched off are switched off three by three. At T62, all the switches PSW are switched off. Therefore, in the present embodiment, it is possible to switch to the standby state faster than the comparative example by ΔT1$b$. ΔT1$b$ in the present embodiment is a longer period of time than ΔT1 in the fourth embodiment.

Effects

According to the present embodiment, the same effects as those of the fourth embodiment can be achieved. Further, instead of changing the parameters using the S-PSWs and the W-PSWs, it is possible to change the parameters using the number of switches PSW. That is, the timing of changing the parameter can be optimized in accordance with the performance of the switches PSW. Therefore, as compared with the fourth embodiment, it is possible to perform the state switching control more suitably for the semiconductor device 1.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor integrated circuit comprising:
a switch circuit that includes a plurality of first switch circuits each allowing a first current to flow and a plurality of second switch circuits each allowing a second current larger than the first current to flow, wherein each of the plurality of first switch circuits and the plurality of second switch circuits is configured to switch between an on state of supplying voltage to a respective one of a plurality of circuits connected thereto and an off state of cutting off the voltage supplied to the respective one of the plurality of circuits connected thereto; and
a control circuit configured to switch to the on state the first switch circuits and then the second switch circuits, wherein two or more of the first switch circuits or two or more of the second switch circuits are simultaneously switched to the on state according to a parameter, wherein
the control circuit includes a register that stores the parameter, a first circuit that calculates a counter value based on the parameter, and a second circuit that decodes the counter value, and
the control circuit switches the first switch circuits or the second switch circuits to the on state based on the decoded counter value.

2. The semiconductor integrated circuit according to claim 1, wherein
the parameter is the number of first switch circuits or second switch circuits that can be switched to the on state simultaneously while a stable voltage is supplied to the plurality of first switch circuits and the plurality of second switch circuits.

3. The semiconductor integrated circuit according to claim 1, wherein
the parameter is one of a first parameter p1 (p1 is a natural number) and a second parameter p2 (p2 is a natural number), at least one of the first parameter p1 and the second parameter p2 being greater than or equal to 2.

4. The semiconductor integrated circuit according to claim 3, wherein
the first switch circuits are switched to the on state according to the first parameter p1, and
the plurality of second switch circuits are switched to the on state according to the second parameter p2.

5. The semiconductor integrated circuit according to claim 1, wherein
the control circuit switches to the off state the second switch circuits and then the first switch circuits, wherein two or more of the first switch circuits or two or more of the second switch circuits are simultaneously switched to the off state according to another parameter.

6. The semiconductor integrated circuit according to claim 5, wherein
said another parameter is one of a third parameter p3 (p3 is a natural number) and a fourth parameter p4 (p4 is a natural number), at least one of the third parameter p3 and the fourth parameter p4 being greater than or equal to 2, and
the second switch circuits are switched to the off state according to the third parameter p3, and the first switch circuits are switched to the off state according to the fourth parameter p4.

7. The semiconductor integrated circuit according to claim 1, further comprising:
a first circuit domain including the control circuit; and
a second circuit domain including a circuit connected to the switch circuit,
wherein the switch circuit is provided between a power supply voltage and the second circuit domain.

8. The semiconductor integrated circuit according to claim 7, wherein
the power supply voltage is supplied to the first circuit domain.

9. The semiconductor integrated circuit according to claim 1, wherein
the parameter is set based on a measurement result of at least one of the plurality of first switch circuits and the plurality of second switch circuits and stored in a non-volatile memory of the semiconductor integrated circuit.

10. A semiconductor integrated circuit comprising:
a switch circuit that includes switches of different types each having a different allowable current, and that is configured to supply voltage to at least one circuit connected to the switches respectively;
a control circuit configured to switch to the on state the switches of a first type having a first allowable current and then the switches of a second type having a second allowable current larger than the first allowable current; and
a register, wherein
two or more of the switches of the same type are simultaneously switched to the on state, according to a parameter that is a natural number and stored in the register, and the parameter stored in the register is changed during a period of time in which the switches are sequentially switched from the off state to the on state or from the on state to the off state.

11. The semiconductor integrated circuit according to claim 10, wherein
the control circuit further switches from the on state to the off state the switches of the second type and then the switches of the first type according to another parameter.

12. The semiconductor integrated circuit according to claim 10, wherein
the switches are MOS transistors provided in parallel so as to be electrically connected between a power supply voltage and at least one circuit connected to the switch circuit, and
the control circuit controls voltages applied to gate terminals of the MOS transistors.

13. The semiconductor integrated circuit according to claim 10, wherein
the control circuit includes the register that stores the parameter, a first circuit that calculates a counter value based on the parameter, and a second circuit that decodes the counter value, and
the control circuit controls switching between the on state and the off state of each of the switches based on the decoded counter value.

14. A semiconductor integrated circuit comprising:
a switch circuit provided between a power supply circuit and a circuit domain to which a power supply voltage is to be supplied, wherein the switch circuit includes a plurality of first switch circuits allowing a first current to flow and a plurality of second switch circuits allowing a second current larger than the first current to flow, wherein each of the first switch circuits and the second switch circuits is configured to switch between an on state of supplying voltage to a respective one of a plurality of circuits connected thereto and an off state of cutting off the voltage supplied to the respective one of the plurality of circuits connected thereto; and
a control circuit configured to switch to the on state the first switch circuits and then the second switch circuits, wherein two or more of the first switch circuits or two or more of the second switch circuits are simultaneously switched to the on state according to a parameter, wherein
the control circuit includes a register that stores the parameter, a first circuit that calculates a counter value based on the parameter, and a second circuit that decodes the counter value, and
the control circuit switches the first switch circuits or the second switch circuits to the on state based on the decoded counter value.

15. The semiconductor integrated circuit according to claim 14, wherein
the parameter is the number of first switch circuits or second switch circuits that can be switched to the on state simultaneously while a stable voltage is supplied to the plurality of first switch circuits and the plurality of second switch circuits.

16. The semiconductor integrated circuit according to claim 14, wherein
the parameter is one of a first parameter p1 (p1 is natural number) and a second parameter p2 (p2 is a natural number), at least one of the first parameter p1 and the second parameter p2 being greater than or equal to 2.

17. The semiconductor integrated circuit according to claim 16, wherein
the first switch circuits are switched to the on state according to the first parameter p1, and
the plurality of second switch circuits are switched to the on state according to the second parameter p2.

* * * * *